(12) United States Patent
Painchaud

(10) Patent No.: US 6,789,774 B2
(45) Date of Patent: Sep. 14, 2004

(54) RETENTION DEVICE FOR RODS AND THE LIKE

(76) Inventor: Maurice Painchaud, 54, rue des Erables, Victoriaville, QBC (CA), G6P 2J1

( * ) Notice: Subject to any disclaimer, the term of this patent is extended or adjusted under 35 U.S.C. 154(b) by 0 days.

(21) Appl. No.: 10/400,657

(22) Filed: Mar. 28, 2003

(65) Prior Publication Data
US 2004/0046098 A1 Mar. 11, 2004

Related U.S. Application Data

(60) Provisional application No. 60/367,761, filed on Mar. 28, 2002.

(51) Int. Cl.$^7$ ............................................. A45B 25/00
(52) U.S. Cl. ................. 248/540; 248/229.14; 248/316.6
(58) Field of Search ................. 248/229.12, 229.15, 248/229.14, 231.61, 534, 535, 539, 540, 541, 316.6, 229.24, 228.5, 229.1, 229.2, 74.4, 230.5, 228.1; 135/16

(56) References Cited

U.S. PATENT DOCUMENTS

| | | | | |
|---|---|---|---|---|
| 263,606 A | * | 8/1882 | Smith | 248/514 |
| 1,253,402 A | | 1/1918 | Lovejoy | 248/541 |
| 1,525,515 A | * | 2/1925 | Socha | 248/514 |
| 2,686,029 A | * | 8/1954 | Raymond | 248/539 |
| 4,136,848 A | | 1/1979 | McCollum | 248/316.7 |
| 4,871,141 A | | 10/1989 | Chen | 248/534 |
| 4,993,670 A | * | 2/1991 | Tesar | 248/68.1 |
| 5,431,364 A | | 7/1995 | Dysarz | 248/514 |
| 5,564,670 A | | 10/1996 | Dysarz | 248/515 |
| 5,566,916 A | * | 10/1996 | Bailey | 248/230.1 |
| 5,582,384 A | | 12/1996 | Schoen | 248/536 |
| 5,685,517 A | | 11/1997 | Salibra | 248/519 |
| 5,722,691 A | * | 3/1998 | Patel | 281/42 |
| 5,931,423 A | * | 8/1999 | Heideloff | 248/74.4 |
| 6,375,146 B1 | | 4/2002 | Painchaud | 248/534 |
| 6,431,502 B1 | * | 8/2002 | Goodman | 248/74.1 |

FOREIGN PATENT DOCUMENTS

JP        2000152864 A    *  6/2000

* cited by examiner

Primary Examiner—Leslie A. Braun
Assistant Examiner—Jon A. Szumny

(57) ABSTRACT

A retention device for retaining a post adjacent a structure having at least one guardrail. The device includes a spacer member with generally opposed spacer first and second ends, an anchoring member for anchoring the spacer member to the structure, and a grasping member for grasping the post to the spacer member. The anchoring member releasably connects to the spacer member adjacent the spacer first end via a first securing assembly so as to clamp the guardrail there between. The grasping member releasably connects to the spacer member adjacent the spacer second end via a second securing assembly so as to clamp the post there between.

12 Claims, 2 Drawing Sheets

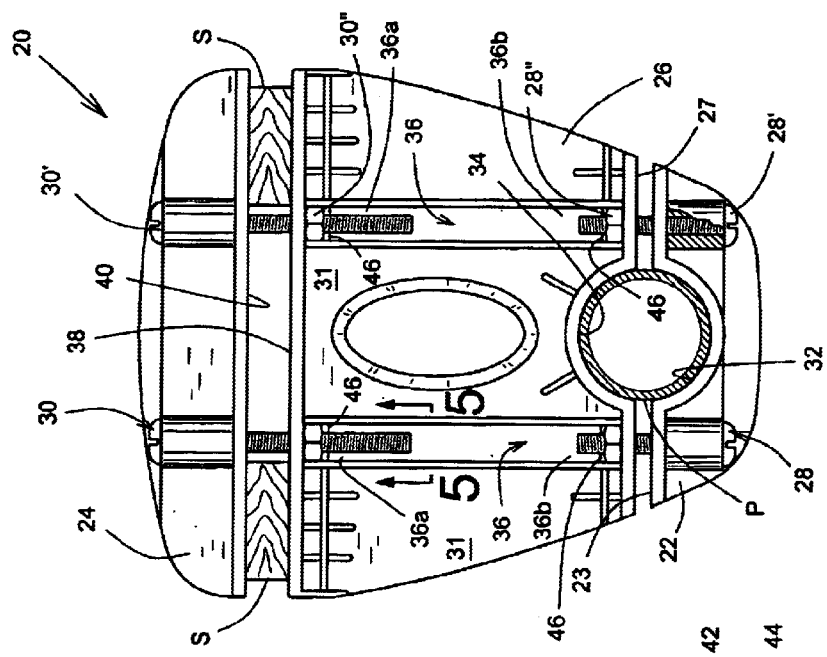
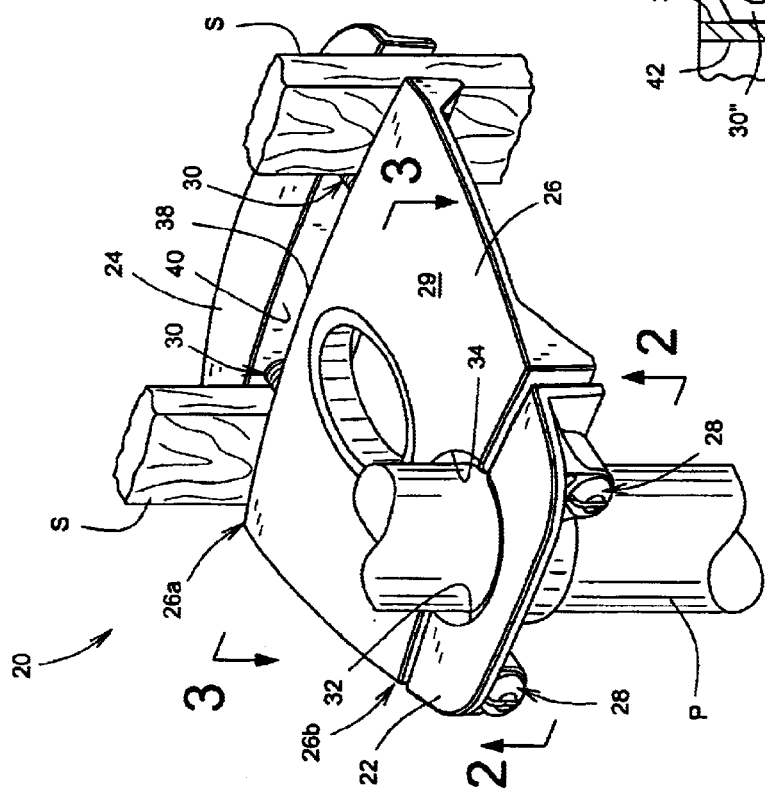
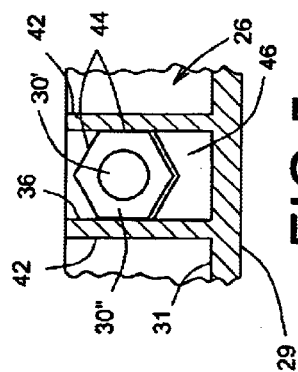
FIG.1
FIG.2
FIG.5

RETENTION DEVICE FOR RODS AND THE LIKE

CROSS-REFERENCE TO RELATED APPLICATION

The present application is related to U.S. provisional application for patent Ser. No. 60/367,761 filed on Mar. 28, 2002.

FIELD OF THE INVENTION

The present invention relates relates to retention devices, more specifically to retention devices that hold cylindrical members such as rods and the like to openwork guardrails or railings.

BACKGROUND OF THE INVENTION

The use of umbrellas or parasols to keep wind, rain or excess solar radiation from individuals is well known. The principle employed is also shared in applications on a relatively larger scale such as picnic tables, patio tables and beach umbrellas as well as in some commercial applications such as sidewalk cafe terraces.

The weight of the umbrella/parasol and the circumference and configuration of its canopy are important factors in determining which anchoring or retention device will be most effective. Another important consideration regarding appropriate retention devices is the location in which the umbrella will be employed in regard to disruptive wind forces.

One of the most common ways to retain or anchor the post of large umbrellas is by utilizing large hollow conical shaped thermo-plastic bases which are filled with sand, water or any other weighty material. This base is laid on the ground and the lower end of the umbrella post is removably secured therein. This is often used when the umbrella is to be positioned at the center of an outdoor patio table especially provided with a portal at its center for an umbrella post.

Since the umbrella has a very high center of gravity, especially when opened under windy conditions, the base must be extremely heavy to enable the umbrella to resist displacement. The base is extremely heavy, very cumbersome and not easily moved when filled. It also necessitates the purchase of an especially made patio table with a portal in the center of its tabletop to accommodate the umbrella shaft. All of these considerations translate into a higher cost for the consumer as well as more time spent in the assembly of this recreational amenity.

The aforementioned umbrellas may conceivably be used without intermediary patio table support but this is usually not recommended by the manufacturer and thus necessitates a recreational space that will accommodate large patio tables. This limitation therefore negates the use of parasols/umbrellas in confined enclosures such as apartment balconies, small patios and the like.

Similarly, no viable possibilities exist for the installation of large umbrellas to be mounted on swimming pool handrails to protect bathers from the sun nor is there any anchoring device available, which permits angular adjustment in relation to the sun's position in the sky.

Prior art approaches to provide an effective anchoring device for large umbrellas/parasols have failed to maximize the utility of the invention and only partially provide an answer to the need for an adaptable, effective, simple and non-damaging anchoring device.

SUMMARY OF THE INVENTION

It is therefore the general object of the present invention to provide a retention device for an umbrella and/or parasol of the character described which obviates the above noted disadvantages.

An advantage of the present invention is that the retention device both grasps the umbrella/parasol post and additionally is securable to an openwork guardrail or railing.

A further advantage of the present invention is that the retention device for an umbrella/parasol is easily mounted and dismounted on a variety of openwork guardrails or railings without damaging the latter.

Another advantage of the present invention is that the retention device for an umbrella/parasol allows the post a variety of angles in relation to the position of the sun.

A further advantage of the present invention is that the retention device for an umbrella/parasol is light weight, safe and is comprised of a minimal number of elements.

A further advantage of the present invention is that the retention device for an umbrella/parasol requires a very basic structural configuration for its installation.

Another advantage of the present invention is that the retention device for an umbrella/parasol is simple to manufacture, easily adapts to any number of conventional umbrella/parasol posts and can be simply attached to a wide variety of anchoring structures without requiring elaborate tools or a great degree of manual dexterity.

According to an aspect of the present invention, there is provided a retention device for retaining a post adjacent a structure, the structure defining at least one guardrail, said device comprises:

a spacer member defining generally opposed spacer first and second ends;

an anchoring member for anchoring said spacer member to the structure, said anchoring member releasably connecting to said spacer member adjacent said spacer first end via a first securing means so as to clamp the guardrail therebetween; and a grasping member for grasping the post to said spacer member, said grasping member releasably connecting to said spacer member adjacent said spacer second end via a second securing means so as to clamp the post therebetween.

In one embodiment, the spacer first end includes a first end abutment surface, said anchoring member including an anchoring abutment surface, said first end abutment surface and said anchoring abutment surface generally facing each other when in abutting engagement with the guardrail so as to clamp the guardrail therebetween. Typically, the first end abutment surface and said anchoring abutment surface are generally elongated planar surfaces.

In one embodiment, the spacer second end includes a second end abutment surface, said grasping member including a grasping abutment surface, said second end abutment surface and said grasping abutment surface generally facing each other when in abutting engagement with the post so as to clamp the post therebetween. Typically, the spacer second end includes a generally concave second end opening extending inwardly from said second end abutment surface, said grasping member including a generally concave grasping opening extending inwardly from said grasping abutment surface, said second end opening and said grasping opening being in abutting engagement with generally radially opposite portions of the post so as to clamp the post therebetween.

In one embodiment, the spacer member includes at least one first end securing channel extending generally inwardly from a position adjacent said spacer first end towards said spacer second end, said at least one first end securing channel being configured and sized to be engageable by a portion of said first securing means therein while preventing rotation thereof.

Typically, the spacer member includes at least one second end securing channel extending generally inwardly from a position adjacent said spacer second end towards said spacer first end, said at least one second end securing channel being configured and sized to be engageable by a portion of said first securing means therein while preventing rotation thereof.

Typically, the spacer member includes generally opposed spacer top and bottom surfaces extending between said spacer first and second ends, said spacer top surface being generally flat, said at least one first and second end securing channels extending generally downwardly from said spacer bottom surface.

Typically, the at least one first and second end securing channels are generally positioned in an end-to-end relationship relative to one another so as to form at least one common securing channel being configured and sized to be longitudinally engageable by a portion of said first and second securing means therein while preventing rotation thereof.

Typically, each of said first and second securing means includes at least one complementary screw and nut, said at least one common securing channel being configured and sized to slidably receive respective said nuts while preventing said nuts from rotating therein so as to allow tightening of said first and second securing means.

Typically, the nuts are polygonal-shaped nuts, said polygonal-shaped nuts defining plurality of pairs of opposed side surfaces, said opposed side surfaces of each of said pairs being spaced from each other by a pre-determined distance, said at least one common securing channel having generally opposed parallel channel sidewalls extending generally downwardly from said spacer bottom surface, said channel sidewalls being spaced form each other by substantially said pre-determined distance so as to slidably and fittingly receive respective said nuts with said opposed side surfaces of one of said pairs facing a respective said channel sidewalls while preventing said nuts from rotating therein.

Typically, the at least one common securing channel includes a transversal web adjacent each one of said spacer first and second ends, each of said transversal web extending downwardly from said spacer bottom surface between said first and second sidewalls, each of said transversal web receiving at least one of said side surfaces of respective said nut in abutment contact thereon so as to prevent said nut from rotating inside said common securing channel while tightening respective of said first and second securing means.

According to another aspect of the present invention, there is provided a retention device for retaining a post adjacent a structure, the structure defining at least one guardrail, said device comprises:

a spacer member defining generally opposed spacer first and second ends;

an anchoring member for anchoring said spacer member to the structure, said anchoring member releasably connecting to said spacer member adjacent said spacer first end via a first securing means so as to clamp the guardrail therebetween;

a grasping member for grasping the post to said spacer member, said grasping member releasably connecting to said spacer member adjacent said spacer second end via a second securing means so as to clamp the post therebetween;

said spacer first end includes a generally elongated planar first end abutment surface, said anchoring member including a generally elongated planar anchoring abutment surface, said first end abutment surface and said anchoring abutment surface generally facing each other when in abutting engagement with the guardrail so as to clamp the guardrail therebetween;

said spacer second end includes a generally concave second end opening extending inwardly from said second end abutment surface, said grasping member including a generally concave grasping opening extending inwardly from said grasping abutment surface, said second end opening and said grasping opening generally facing each other when in abutting engagement with generally radially opposite portions of the post so as to clamp the post therebetween;

said second securing means including a pair of complementary screw and nut assemblies engaging both said spacer second end and said grasping member, said screw and nut assemblies being spaced apart from each other on either sides of both said second end opening and said grasping opening so as to enclose the post therebetween when the post is clamped to said retention device.

Other objects and advantages of the present invention will become apparent from a careful reading of the detailed description provided herein, with appropriate reference to the accompanying drawings.

BRIEF DESCRIPTION OF THE DRAWINGS

In the annexed drawings, like reference characters indicate like elements throughout.

FIG. 1 is a top perspective view of an embodiment of an umbrella/parasol post retention device in accordance with the present invention;

FIG. 2 is a bottom plan view taken along line 2—2 of FIG. 1, showing the embodiment of FIG. 1;

FIG. 5 is a partially broken enlarged section view taken along line 5—5 of FIG. 2.

DETAILED DESCRIPTION OF THE PREFERRED EMBODIMENT

With reference to the annexed drawings the preferred embodiments of the present invention will be herein described for indicative purpose and by no means as of limitation.

Figure 3:
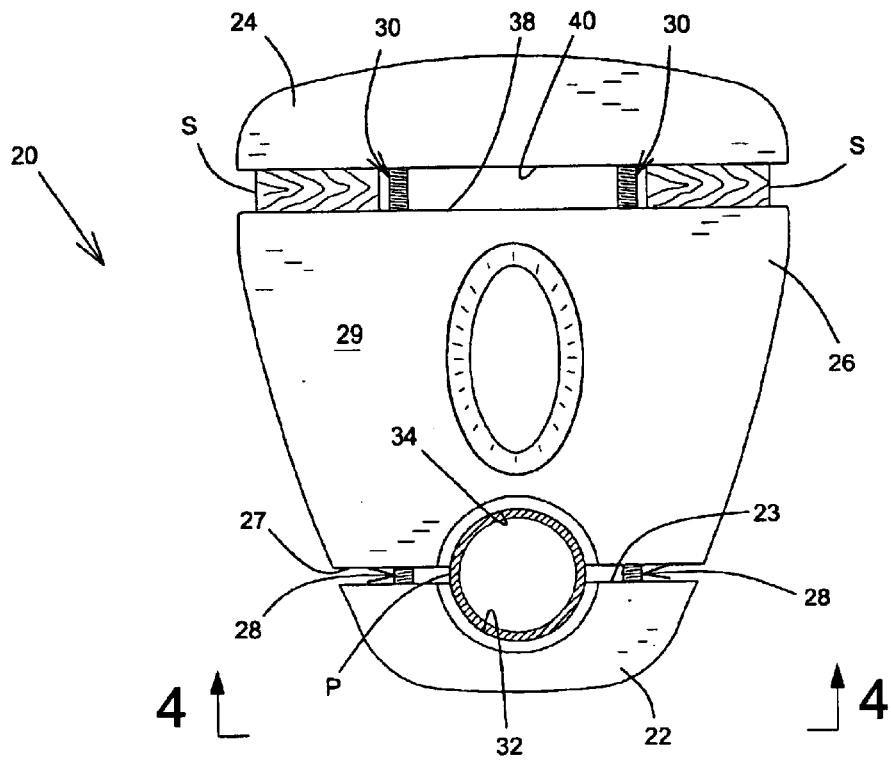
FIG. 3 is a top plan view taken along line 3—3 of FIG. 1, showing the embodiment of FIG. 1.
Figure 4:
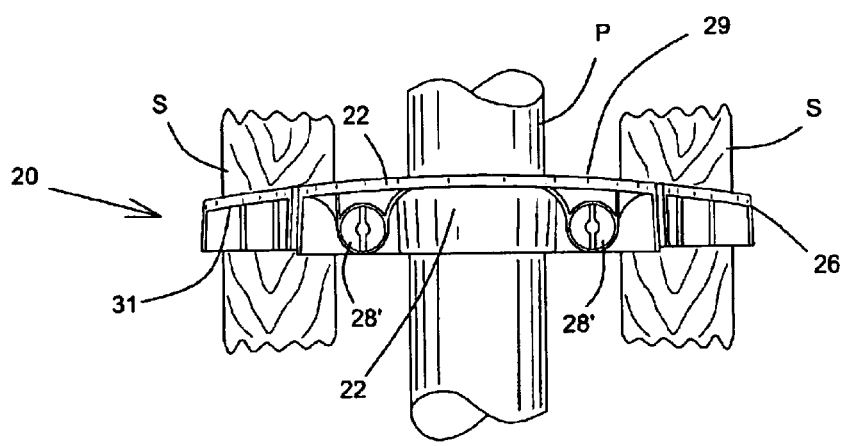
FIG. 4 is a front elevation view taken along line 4—4 of FIG. 3.

Referring to FIGS. 1 through 4 there is shown an embodiment of an anchoring and retention device 20 according to the present invention. The retention device 20 is comprised of three components being a grasping member 22, an anchoring member 24, and an intermediary post/anchor retainer, or spacer member 26. These components 22, 24, 26 are secured together by two pairs of securing assemblies or means being the first, or proximal, securing means 30 and the second, or distal, securing means 28.

The retention device 20 is preferably rounded triangular in shape with a slight camber to the left and right sides from the center to effect drainage. It is typically constructed of a sturdy, environmentally safe, durable thermo-plastic material.

The grasping member 22 at the second, or distal, spacer end 26b of the retention device 20 is provided with a concave, preferably semi-circular, portal or opening 32 extending inwardly from a grasping abutment surface 23 and designed to accept any standard tubular umbrella/parasol post P.

In a like manner, the intermediary post/anchor retainer 26 is also provided with a corresponding concave, preferably semi-circular, portal or opening 34 extending inwardly from a second end abutment surface 27 at its first, or distal, spacer end 26a to accommodate the aforementioned tubular post P. The tubular post P is secured into place by a tightening of the distal securing assembly 28 which is comprised of a, preferably two, conventional sets of nuts 28" and screws 28'. The tightening procedure of the distal securing assembly 28 is facilitated by the presence of a pair of lock nut or securing channels 36 which are typically parallel to one another and run the length of the intermediary post/anchor retainer 26 and whose internal transversal width, or transversal distance between the two side walls 42, is substantially the same as the distance between two radially opposite side surfaces 44 of the polygonal-shaped nut 28" of the distal securing assembly 28 so as to prevent rotation of the nut 28" within the channel 36, at a second end channel 36b, as illustrated in FIG. 5. At its proximal end 26a, the intermediary post/anchor retainer 26 has a generally elongated planar or flat external abutment surface 38 designed to interface between the anchor support structure S and the anchoring member 24. It can accommodate the anchoring member 24 via the proximal securing assembly 30 which is similar in construction to the distal securing assembly 28 except that the length of the bolts 30', fitting with nuts 30", would preferably be longer to accommodate a variety of anchor support structures S.

The anchoring member 24 also has a generally elongated planar or flat external abutment surface 40 on its distal side to interface between the anchor support structure S and the intermediary post/anchor retainer 26. The tightening procedure to secure the anchoring member 24 to the anchor support structure S is identical to that mentioned above regarding the grasping member 22 and the intermediary post/anchor retainer 26 in that the proximal securing assembly 30 again takes advantage of the lock nut channels 36, at a first end channel 36a.

A retention device 20 for retaining a post P adjacent a structure S, including at least one guardrail S, comprises:

a spacer member 26 defining generally opposed spacer first 26a and second 26b ends;

an anchoring member 24 for anchoring the spacer member 26 to the structure S, the anchoring member 24 releasably connecting to the spacer member 26 adjacent the spacer first end 26a via a first securing means 30 so as to clamp the guardrail S therebetween; and a grasping member 22 for grasping the post P to the spacer member 26, the grasping member 22 releasably connecting to the spacer member 26 adjacent the spacer second end 26b via a second securing means 28 so as to clamp the post P therebetween.

The spacer first end 26a includes a first end abutment surface 38 and the anchoring member 24 includes an anchoring abutment surface 40. The first end abutment surface 38 and the anchoring abutment surface 40 generally face each other when in abutting engagement with the guardrail S so as to clamp the guardrail S therebetween.

The first end abutment surface 38 and the anchoring abutment surface 40 are generally elongated planar surfaces.

The spacer second end 26b includes a second end abutment surface 27 and the grasping member 22 includes a grasping abutment surface 23. The second end abutment surface 27 and the grasping abutment surface 23 generally-face each other when in abutting engagement with the post P so as to clamp the post P therebetween.

The spacer second end 26b includes a generally concave second end opening 34 extending inwardly from the second end abutment surface 27. The grasping member 22 includes a generally concave grasping opening 32 extending inwardly from the grasping abutment surface 23. The second end opening 34 and the grasping opening 32 are in abutting engagement with generally radially opposite portions of the post P so as to clamp the post P therebetween.

The spacer member 26 includes at least one first end securing channel 36a extending generally inwardly from a position adjacent the spacer first end 26a towards the spacer second end 26b. The first end securing channel 36a is engageable by a portion 30" of the first securing means 30 therein.

The spacer member 26 includes at least one second end securing channel 36b extending generally inwardly from a position adjacent the spacer second end 26b towards the spacer first end 26a. The second end securing channel 36b is engageable by a portion 28" of the first securing means 28 therein.

The spacer member 26 includes generally opposed spacer top 29 and bottom 31 surfaces extending between the spacer first and second ends 26a, 26b. The spacer top surface 29 is generally flat and slightly convex. The first 36a and second 36b end securing channels extend generally downwardly from the spacer bottom surface 31.

The first and second end securing channels 36a, 36b are generally positioned in an end-to-end relationship relative to one another so as to form at least one common securing channel 36 that is longitudinally engageable by a portion 30", 28" of the first 30 and second 28 securing means therein, respectively.

Each of the first 30 and second 28 securing means includes at least one complementary screw 30', 28' and nut 30", 28". The common securing channel 36 is configured and sized to slidably receive respective the nuts 28", 30" while preventing the nuts 28", 30" from rotating therein so as to allow tightening of the first and second securing means 30, 28.

As shown in FIG. 5, the nuts 28", 30" are preferably polygonal-shaped nuts defining plurality of pairs of opposed side surfaces 44. The opposed side surfaces 44 of each of the pairs are spaced from each other by a pre-determined distance and the common securing channels 36 have generally opposed parallel channel sidewalls 42 extending generally downwardly from the spacer bottom surface 31 and spaced form each other by substantially the pre-determined distance so as to slidably and fittingly receive respective the nuts 28", 30" with the opposed side surfaces 44 of one of the pairs facing a respective channel sidewall 42 while preventing the nuts 28", 30" from rotating therein.

The common securing channel 36 includes a transversal web 46 adjacent preferably each spacer first 26a and second 26b ends. Each transversal web 46 extends downwardly from the spacer bottom surface 31 between the first and second sidewalls 42, and receives at least one of the side surfaces 44 of a respective nut 28", 30" in abutment contact thereon so as to prevent the nut 28", 30" from rotating inside the common securing channel 36 while tightening respective of the first 30 and second 28 securing means.

Typically, the second securing means 28, and preferably the first securing means 30, includes a pair of complementary screw 28' and nut 28" assemblies engaging both the spacer second end 26b and the grasping member 22. The screw and nut assemblies 28 are spaced apart from each other on either sides of both the second end opening 34 and the grasping opening 32 so as to enclose the post P therebetween when the post P is clamped to the retention device 20.

Although the present retention device for rods and the like has been described with a certain degree of particularity, it is to be understood that the disclosure has been made by way of example only and that the present invention is not limited to the features of the embodiments described and illustrated herein, but includes all variations and modifications within the scope and spirit of the invention as hereinafter claimed.

I claim:

1. A retention device for retaining a post adjacent a structure, the structure defining at least one guardrail, said device comprising:

a spacer member defining a top surface and generally opposed spacer first and second ends;

an anchoring member for anchoring said spacer member to the structure, said anchoring member releasably connecting to said spacer member adjacent said spacer first end via a first securing means so as to clamp the guardrail therebetween;

a grasping member for grasping the post to said spacer member, said grasping member releasably connecting to said spacer member adjacent said spacer second end via a second securing means so as to clamp the post therebetween;

said spacer first end including a generally elongated planar first end abutment surface that extends generally perpendicularly downward from the top surface said anchoring member including a generally elongated planar anchoring abutment surface, said first end abutment surface and said anchoring abutment surface generally facing each other when in abutting engagement with the guardrail so as to clamp the guardrail therebetween.

2. The retention device of claim 1, wherein said spacer second end includes a second end abutment surface, said grasping member including a grasping abutment surface, said second end abutment surface and said grasping abutment surface generally facing each other when in abutting engagement with the post so as to clamp the post therebetween.

3. The retention device of claim 2, wherein said spacer second end includes a generally concave second end opening extending inwardly from said second end abutment surface, said grasping member including a generally concave grasping opening extending inwardly from said grasping abutment surface, said second end opening and said grasping opening being in abutting engagement with generally radially opposite portions of the post so as to clamp the post therebetween.

4. A retention device for retaining a post adjacent a structure, the structure defining at least one guardrail, said device comprising:

a spacer member defining generally opposed spacer first and second ends;

an anchoring member for anchoring said spacer member to the structure, said anchoring member releasably connecting to said spacer member adjacent said spacer first end via a first securing means having a longitudinal axis so as to clamp the guardrail therebetween;

a grasping member for grasping the post to said spacer member, said grasping member releasably connecting to said spacer member adjacent said spacer second end via a second securing means so as to clamp the post therebetween; and at least one first end securing channel having a longitudinal axis extending generally inwardly from a position adjacent said spacer first end towards said spacer second end, said longitudinal axis of said at least one first end securing channel being configured and sized to be engageable by said longitudinal axis of said first securing means therein while preventing rotation thereof.

5. The retention device of claim 4, wherein said spacer member includes generally opposed spacer top and bottom surfaces extending between said spacer first and second ends, said spacer top surface being generally flat, said at least one first end securing channel extending generally downwardly from said spacer bottom surface.

6. The retention device of claim 4, wherein said spacer member includes at least one second end securing channel extending generally inwardly from a position adjacent said spacer second end towards said spacer first end, said at least one second end securing channel being configured and sized to be engageable by a portion of said first securing means therein while preventing rotation thereof.

7. The retention device of claim 6, wherein said spacer member includes generally opposed spacer top and bottom surfaces extending between said spacer first and second ends, said spacer top surface being generally flat, said at least one first and second end securing channels extending generally downwardly from said spacer bottom surface.

8. The retention device of claim 7, wherein said at least one first and second end securing channels are generally positioned in an end-to-end relationship relative to one another so as to form at least one common securing channel being configured and sized to be longitudinally engageable by a portion of said first and second securing means therein while preventing rotation thereof.

9. The retention device of claim 8, wherein each of said first and second securing means includes at least one complementary screw and nut, said at least one common securing channel being configured and sized to slidably receive respective said nuts while preventing said nuts from rotating therein so as to allow tightening of said first and second securing means.

10. The retention device of claim 9, wherein said nuts are polygonal-shaped nuts, said polygonal-shaped nuts defining plurality of pairs of opposed side surfaces, said opposed side surfaces of each of said pairs being spaced from each other by a pre-determined distance, said at least one common securing channel having generally opposed parallel channel sidewalls extending generally downwardly from said spacer bottom surface, said channel sidewalls being spaced from each other by substantially said pre-determined distance so as to slidably and fittingly receive respective said nuts with said opposed side surfaces of one of said pairs facing a respective said channel sidewalls while preventing said nuts from rotating therein.

11. The retention device of claim 10, wherein said at least one common securing channel includes a transversal web adjacent each one of said spacer first and second ends, each of said transversal web extending downwardly from said spacer bottom surface between said first and second sidewalls, each said transversal web receiving at least one of said side surfaces of a respective said nut in abutment contact thereon so as to prevent said nut from rotating inside said common securing channel while tightening of said respective first and second securing means.

12. A retention device for retaining a post adjacent a structure, the structure defining at least one guardrail, said device comprising:

a spacer member defining generally opposed spacer first and second ends;

an anchoring member for anchoring said spacer member to the structure, said anchoring member releasably connecting to said spacer member adjacent said spacer first end via a first securing means so as to clamp the guardrail therebetween;

a grasping member for grasping the post to said spacer member, said grasping member releasably connecting to said spacer member adjacent said spacer second end via a second securing means so as to clamp the post therebetween;

said spacer first end includes a generally elongated planar first end abutment surface, said anchoring member including a generally elongated planar anchoring abutment surface, said first end abutment surface and said anchoring abutment surface generally facing each other when in abutting engagement with the guardrail so as to clamp the guardrail therebetween;

said spacer second end includes a generally concave second end opening extending inwardly from said second end abutment surface, said grasping member including a generally concave grasping opening extending inwardly from said grasping abutment surface, said second end opening and said grasping opening generally facing each other when in abutting engagement with generally radially opposite portions of the post so as to clamp the post therebetween;

said second securing means including a pair of complementary screw and nut assemblies engaging both said spacer second end and said grasping member, said screw and nut assemblies being spaced apart from each other on either sides of both said second end opening and said grasping opening so as to enclose the post therebetween when the post is clamped to said retention device.

* * * * *